United States Patent [19]

Follegot

[11] Patent Number: 5,032,540
[45] Date of Patent: Jul. 16, 1991

[54] A PROCESS FOR MODULATING THE QUANTITY OF GOLD DIFFUSED INTO A SILICON SUBSTRATE

[75] Inventor: Jean-Pierre Follegot, Aix-En-Provence, France

[73] Assignee: SGS-Thomson Microelectronics S.A., Gentilly, France

[21] Appl. No.: 433,377

[22] Filed: Nov. 8, 1989

[30] Foreign Application Priority Data

Nov. 9, 1988 [FR] France ............................ 88 15728

[51] Int. Cl.$^5$ ............................................ H01L 29/67
[52] U.S. Cl. ..................................... 437/142; 437/94; 437/6; 437/146
[58] Field of Search ................... 437/142, 94, 6, 146

[56] References Cited

U.S. PATENT DOCUMENTS 4,140,560  2/1979  Rodov ................................ 437/142
4,551,744  11/1985  Suzuki .................................. 357/64

OTHER PUBLICATIONS

F. Morehead et al., "Self-Interstitial and Vacancy Contributions to Silicon Self-Diffusion Determined from the Diffusion of Gold in Silicon", Appl. Phys. Lett., vol. 42, No. 8 (Apr. 1983), pp. 690-692.

N. A. Stolwijk et al., "Diffusion and Solubility of Gold in Silicon", Physica 116B (1983), pp. 335-342.

N. A. Stolwijk et al., "Diffusion of Gold in Dislocation-Free or Highly Dislocated Silicon Measured by the Spreading-Resistance Technique", Appl. Phys., vol. 39, No. 1 (1986), pp. 37-48.

Takuzo Ogawa et al., "On Determination of Gold Trap Concentration in Diffused Silicon pn Junctions", Japanese Journal of Applied Physics, vol. 9, No. 1 (Jan. 1970), pp. 81-89.

Ghandi, S. K., VLSi Fabrication Principles, A Wiley-Interscience Publication, New York (1983).

Sze, S. M., Physics of Semiconductor Devices, A Wiley-Interscience Publication, New York (1981).

Baldi, L. et al., Phys. Stat. Sol. (a), 48, pp. 523 (1978). "Gold Solubility & Gettering by Phosphorus".

Primary Examiner—Brian E. Hearn
Assistant Examiner—Gordon V. Hugo
Attorney, Agent, or Firm—Lowe, Price, LeBlanc, Becker & Shur

[57] ABSTRACT

For modulating the quantity of gold diffused in a silicon substrate, prior to gold diffusion, one realizes a diffusion of phosphorus varying within a $10^{13}$ to $10^{15}$ atoms/cm$^3$ range. The concentration of phosphorous is increased at the places where one wishes to increase the gold concentration.

8 Claims, 3 Drawing Sheets

A PROCESS FOR MODULATING THE QUANTITY OF GOLD DIFFUSED INTO A SILICON SUBSTRATE

BACKGROUND OF THE INVENTION

The instant invention relates to the field of semiconductors and especially to processes for diffusing metals such as gold into silicon.

In various types of semiconductor components, and more particularly in power components, one tries to reduce the lifetime of the minority carriers in a specific semiconductor layer. For this purpose, one creates in those layers carrier recombination centres. Such recombination centres are liable to correspond to areas wherein gold or platinum diffusion is carried out, or to areas wherein dislocations have been created, for example by implanting electrons, protons, ions, etc.

With ion or proton implantations, it is theoretically possible to obtain higher dislocation densities at selected depths in a semiconductive layer or wafer by selecting the implantation mode. However, such processes do not make it possible to obtain very short lifetimes. Thus, for obtaining very short lifetimes, it is conventionally necessary to use gold diffusion processes, but it is not possible with the processes of the prior art to modulate in the depth direction the gold concentration in the semiconductive layer or wafer wherein the diffusion is carried out.

SUMMARY OF THE INVENTION

Thus, the instant invention provides, on the one hand, for a method permitting to carry out such a concentration modulation of gold atoms and, on the other hand, a specific application of this method for realizing a high-speed diode, the performances of which are improved.

In order to attain those objects, the invention provides for a process modulating the quantity of a metal such as gold diffused in a silicon substrate consisting, prior to gold diffusion, in realizing a diffusion of a dopant such as phosphorus varying within a $10^{13}$ to $10^{15}$ atoms/cmp$^3$ range, the dopant concentration being increased at the places where one wishes to increase the metal concentration.

According to an embodiment of the invention, the substrate is of the quasi-intrinsic N-type doped with phosphorus at a concentration of about a few $10^{13}$ atoms/cm$^3$ and the phosphorus concentration is raised to about $10^{15}$ atoms/cm$^3$ at the places where one wishes to increase the gold concentration.

According to another embodiment of the invention, a region having a variable phosphorus concentration is formed in the thickness of the substrate, for example by epitaxy, onto a non-doped or a differently-doped substrate.

According to an aspect, the invention provides for a manufacturing method of a PNN+ high-speed diode comprising on an N+-type substrate, an N-type silicon epitaxial layer and a highly doped P layer, the thickness of the epitaxial layer being such that, at the nominal operating voltage at the off-state, the depleted area spreads over that whole epitaxial layer, wherein the epitaxial layer is doped by atoms of phosphorus having a higher doping level close to the P layer, and a diffusion of gold atoms is achieved in the resulting structure. The epitaxial layer preferably comprises a first sub-layer on the substrate side with a doping level of about $10^{13}$ to $10^{14}$ atoms/cm$^3$ and a second sub-layer on the P+ layer side with a phosphorus concentration of about $10^{14}$ to $10^{15}$ atoms/cm$^3$.

The instant invention also provides for a PNN+ high-speed diode obtained by the above-mentioned method.

BRIEF DESCRIPTION OF THE DRAWINGS

The foregoing and other objects, feature, advantages of the invention will be apparent from the following detailed description of preferred embodiments as illustrated in the accompanying drawings wherein.

DETAILED DESCRIPTION OF THE INVENTION

Figure 1A:
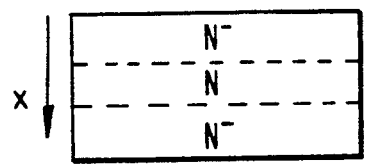
FIG. 1A schematically shows a section view of an N− NN− semiconductive structure.

Thus, FIG. 1A is a schematic section view of a semiconductor substrate comprising in superposition an N− layer, that is, an N layer having a low doping level, an N layer and an N− layer.

Figure 1B:
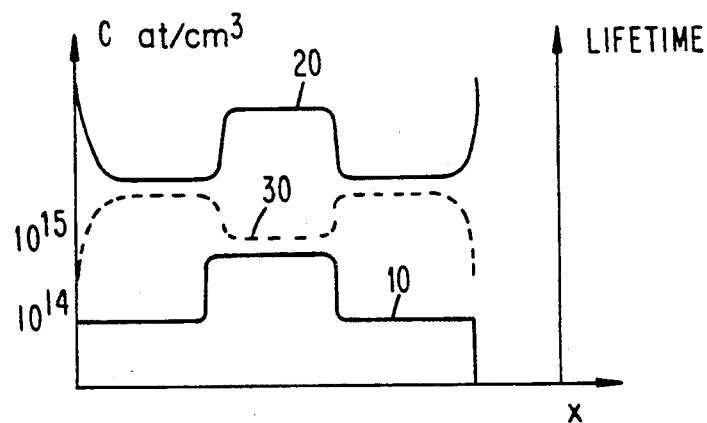
FIGS. 1B and 1C show curves of phosphorus concentration, gold concentration, and lifetime relative to the structure of FIG. 1A.

Curve 10 of FIG. 1B shows the doping profile of this structure in the direction of the arrow x of FIG. 1A. It is assumed that the N− layers have a carrier concentration of about $10^{14}$ atoms/cm$^3$ and the N layer has a carrier concentration of about $10^{15}$ atoms/cm$^3$ and that the dopant imparting the N-type conductivity is phosphorus.

In this case, if a gold diffusion is realized into the structure of FIG. 1A, it is noted that this diffusion exhibits a profile corresponding to curve 20, that is, the gold diffusion exhibits active centres where gold is arranged in substitutional positions and not in distributed interstitial positions.

As shown by curves 10 and 20, the concentration of gold atoms arranged in a substitutional way follows the profile of the phosphorus concentration. Tests carried out by the Applicant show that this relation remains true provided that the phosphorus concentration varies between $10^{13}$ and $10^{15}$ atoms/cm$^3$. One can therefore modulate the concentration of the recombination centres through gold diffusion while having preliminarily realized gradients of phosphorus diffusion. It will be noted that, conventionally, the gold concentration is higher near the faces of the structure.

Figure 1C:
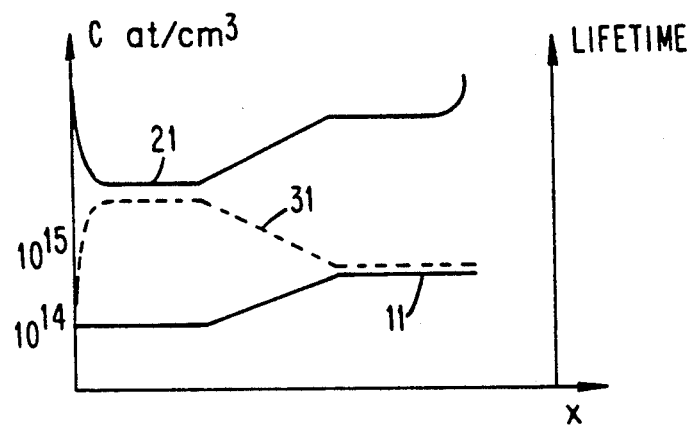

In FIG. 1C curve 11 shows the concentration profile of a structure of the same type wherein there is an N-type lower layer, the doping level of which is about $10^{14}$ atoms/cm$^3$ and an upper layer which exhibits a concentration of about $10^{15}$ atoms/cm$^3$, the intermediate layer having a phosphorus doping level gradually varying between $10^{14}$ and $10^{15}$ atoms/cm$^3$. Similarly, the concentration of gold atoms shown by curve 21 follows this concentration. In FIGS. 1B and 1C, curves 30 and 31 show corresponding lifetimes in the various layers after gold diffusion, those lifetimes being inversely proportional to the concentration of the substitutional gold atoms.

This possibility for depthwise modulating the gold concentration in a semiconductive layer, that is, the concentration in recombination centres, and therefore modulating the lifetime of the carriers, is liable to present various applications in the field of the semiconductor components and especially power components. A specific application to the high-speed diodes will be described hereinafter, this application being illustrative and not limitative of the possible applications of the instant invention.

The parameters having an effect on the manufacturing of high-speed diodes are disclosed in Canadian patent 1,232,974.

The problems encountered for the realization of high-speed diodes are explained in relation with FIGS. 2-6 of the instant invention which correspond to FIGS. 1-5 of the above-mentioned Canadian patent.

Figure 2:
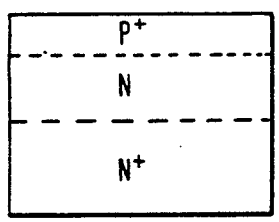
FIGS. 2-6 are designed to describe the prior art and the problems that are encountered for realizing a high-speed diode and correspond to FIGS. 1-5 of Canadian patent 1,232,974 filed in the name of Thomson CSF.

As shown in FIG. 2, a high-speed diode conventionally comprises a P+NN+ structure.

Figure 3:
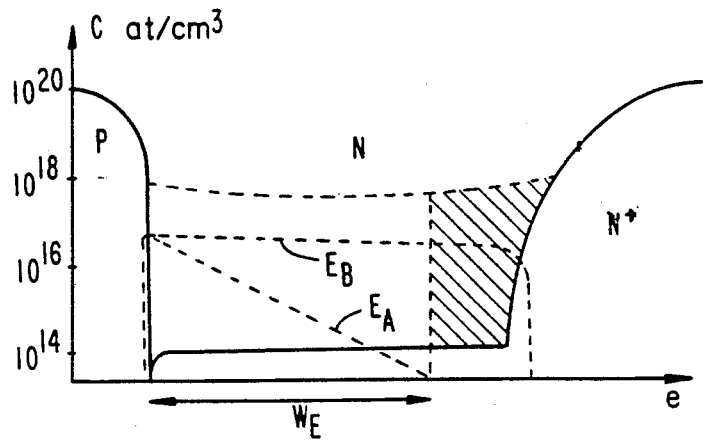

FIG. 3 shows in solid lines the concentration of the doping atoms in such a diode. As shown by the curve drawn in dotted lines in FIG. 3, when a d.c. current flows through this diode, a given quantity of charges is injected into the N-type low doped area. This quantity of charges or injected carriers depends upon the current flowing through the diode. The quantity of charges stored during the forward conduction and remaining at the time $t_O$ of the switching cycle is usually designated by $Q_O$ and is called stored charge. It is written by a relation of the type:

$$Q_O I_F \text{ or } Q_O^2 \, dI_F/dt$$

according to the value of duration $t_O - t_F$ (as indicated in the drawings) with respect to the value of t where t is the lifetime of the minority carriers in the N-type area of the diode and where $I_F$ is the d.c. current in the diode.

When the voltage across the circuit comprising the diode is reversed or when the current is diverted towards another part of the circuit, a voltage value equal to that of the applied reverse voltage is not immediately found again across this diode. On the contrary, some time passes during which the diode can be compared with a reverse short-circuit, until it recovers its blocking capacity.

Indeed, during the switching phase, for a high-speed diode, a portion of the charge $Q_O$ spontaneously disappears through internal recombination (correlated with the lifetime of the minority carriers), but the other portion, called recovery charge $Q_R$, which essentially intervenes in the considered phenomenon is drained off by the reverse current flowing in the diode. This recovery charge supplies the recovery reverse current and causes all the switching phenomena (overvoltage, overheating, spurious pulses, etc.).

Figure 4:
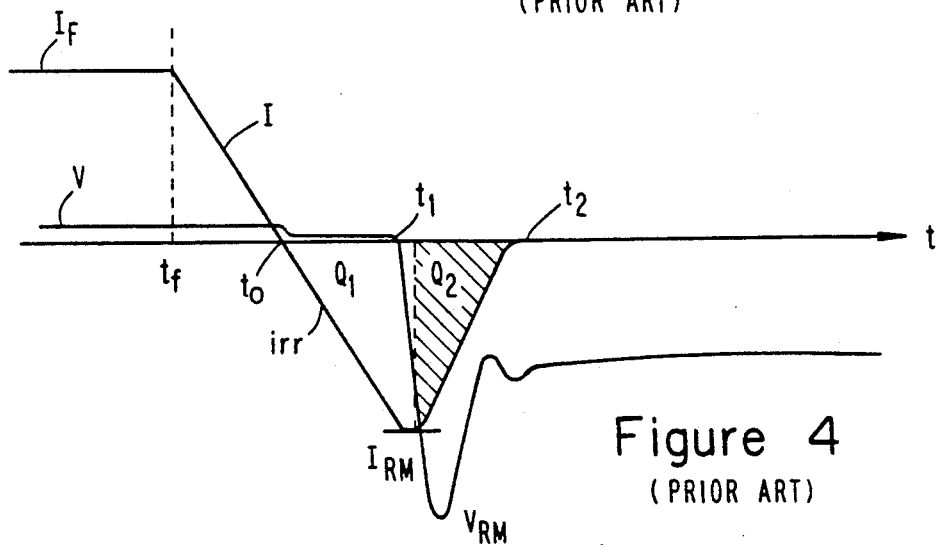

The reverse recovery can be decomposed into two parts (also refer to FIG. 4).

During the first part, at the closing time $t_F$ of the switching circuit switch, the d.c. current starts decreasing, gets null and a reverse current $i_{rr}$ is established. The decrease speed of the d.c. current, then the increase speed of the reverse current, are generally exclusively determined by the circuit in which the diode is connected. During this first part, a quantity of charges $Q_1$ is drained off.

From the time $t_1$, the diode retrieves its blocking capacity. The reverse current starts decreasing. The neighbourhood of the junction becomes free of carriers (creation of a depleted area or space charge area). A charge $Q_2$ corresponding to the hatched area in FIG. 4 is then to be drained off while the reverse current decreases and gets null.

Finally, after the time $t_2$, the current variation being null, only the applied reverse voltage remains across the diode.

In order to more accurately determine the operation, it is necessary to examine to which physical parameters the charges $Q_1$ and $Q_2$ correspond. The shape of the depleted area or space charge area in the diode will be considered in two specific cases. In FIG. 3, curves $E_A$ and $E_B$ are drawn in dotted lines showing the distribution of the electric field when the diode is in the blocking state. In the case corresponding to curve $E_A$, the thickness of the N region is greater than the width $W_E$ of the depleted area. In the case of curve $E_B$, the depleted area spreads over the whole thickness of the N region.

Between $t_0$ and $t_1$, all the injected carriers that are arranged in the space charge region are, in particular, eliminated. In the case of curve $E_A$ (the N layer is thick with respect to the depleted region extension), some injected carriers still remain after this first phase and the charge $Q_2$ corresponds to carriers which were in the hatched area of FIG. 3. In the case of curve $E_B$, the charge $Q_2$ is practically null and consequently the lapse of time between $t_1$ and $t_2$ is very short; the inverse current passes very quickly from its maximum amplitude $I_{RM}$ to a null value. Because of this very fast current variation, high overvoltages $V_{RM}$ occur and current and voltage oscillations appear.

In practice, for manufacturing a high-speed diode for which the space charge has a configuration indicated by curve $E_A$, one starts from the reverse bias voltage to be obtained. The latter determines the resistivity of the N silicon to be used. From this information, one calculates the extension of the space charge $W_E$ and the thickness of the N layer, $W_N$, higher than $W_E$, is selected. Afterwards, one proceeds to a reduction of the lifetime t of the minority carriers (gold or platinum diffusion, electron bombardment, etc.); it is in fact this physical information which, for given conditions $I_F$ and $dI_F/dt$, determines the quantity of store $Q_O$ and, therefrom, the switching speed of the diode ($t_1 - t_0$, $t_2 - t_0$, $I_{RM}$). It is not possible to reduce the lifetime at will. In order that the diode keeps its adequate characteristics at the conductive state (characteristics $V_F = f(I_F)$), it is necessary to maintain the lifetime above a, minimum value which essentially depends upon the thickness $W_N$ of the central N layer, and the minimum value of which is proportional to $W_N^2$. It is therefore not possible to reduce below a given threshold the charge $Q_O$. $I_F$ and, consequently, the recovery time of the diode.

Therefore, in order to reduce $Q_O$, it is necessary to be able to reduce the lifetime and consequently the thickness of the N layer of the diode and adopt a configuration corresponding to the curve $E_B$ of FIG. 3. Nowadays, one uses for a same reverse breakdown voltage a much higher silicon resistivity. Under reverse voltage, the decrease in intensity of the electric field from the junction will be gradual (layer $E_B$) and the thickness of the N layer, $W_N$, is determined by the required breakdown voltage of the diode design This thickness can be reduced by a ratio practically equal to 2 with respect to the preceding case. This will then permit the lifetime to be reduced to a substantially lower level (usually 4 times lower) and therefore to obtain much quicker diodes for which the value of $I_{RM}$ is substantially lower than in the preceding case. However, as already seen, the drawback is that the charge $Q_2$ is then very low and high voltages occur at switching.

Figure 5:
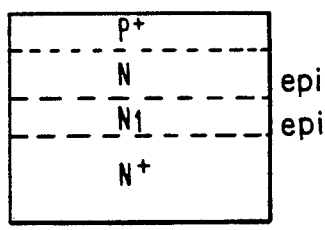

In order to resolve those problems, the abovementioned patent provided for a structure such as the one illustrated in FIG. 5. The diode of FIG. 5 is made from an N+-type substrate and comprises the conventional N-type and P+-type layers. In addition, this diode comprises an intermediate N-type layer, called $N_1$, between the N+-substrate and the N-type slightly doped layer. As it is conventional, the N+ and P+-type layers have doping levels as high as possible, higher than $10^{18}$ atoms/cm$^3$. The N layer, quasi-intrinsic, has a doping level of about $10^{13}$ to some $10^{14}$ atoms/cm$^3$. In a usual configuration, the layer $N_1$ 1 has a doping level of about $10^{14}$ to $10^{16}$ atoms/cm$^3$, but it will be seen that this doping level is a function of the nominal operating characteristics of the diode. The $N_1$ and N layers are preferably formed by successive epitaxies on the N+ substrate. The P+ layer is for example formed by means of diffusion in the N layer.

Figure 6:
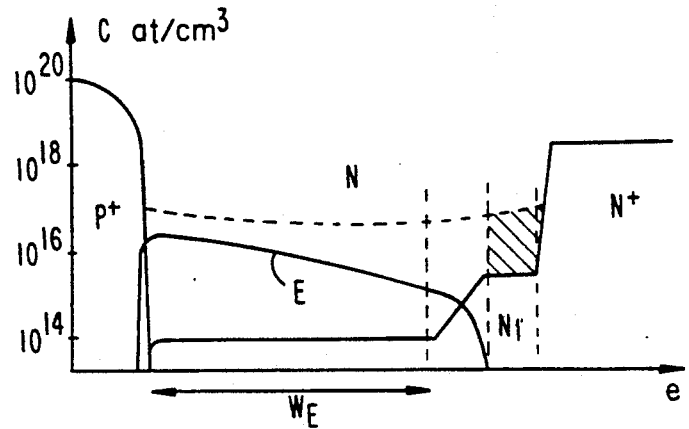

FIG. 6 shows in solid line the concentration variation of dopants in the diode as a function of the thickness. The concentration of the exceeding free carriers at the time $t_O$ of the switching cycle is drawn in dotted lines. This quantity of carriers depends upon the nominal current in the diode and/or upon the switching speed imposed by the circuit.

The curve E shows the distribution of the electric field when the diode is in the blocked state, $W_E$ designating the extension of the depleted area when the diode is in the off-state for the nominal voltage it is liable to withstand.

During the blocking of the diode, between the times $t_0$ and $t_1$, the injected carriers located in the area that will be depleted at the time $t_1$ are eliminated, and the carriers located in the hatched area of FIG. 6 will correspond to the charge $Q_2$ drained off between the times $t_1$ and $t_2$.

According to the above-mentioned patent, it is essential that the number of those carriers be sufficient so that the transition between the times $t_1$ and $t_2$ is not too short and so that a too high overvoltage $V_{RM}$ does not occur.

In order to set the period of time passing between the times $t_1$ and $t_2$, one uses the thickness and the doping level of the $N_1$ layer in a determined way. This doping level, intermediate between the doping levels of the N and N+ layers will have to be lower than the density of the injected charge during the direct conduction.

One of the drawbacks of the structure provided for in FIG. 5, corresponding to the above-mentioned patent, is that it is necessary, with respect to the diode structure of FIGS. 2 and 3, to increase the width of the N region and therefore to increase the resistance of the diode at the conducting state.

The instant invention provides for another method, based on the possibility to modulate the concentration of gold atoms and therefore the lifetime, as mentioned hereinabove.

Figure 7:
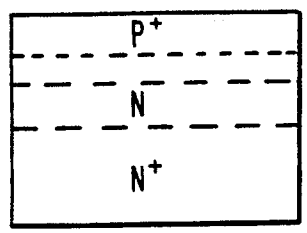
FIG. 7 is a section view of a structure according to the instant invention.
Figure 8:
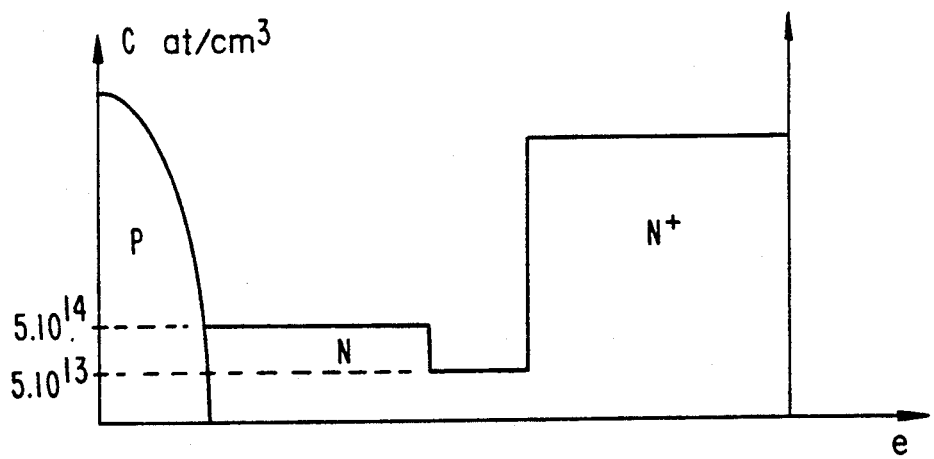
FIGS. 8 and 9 show the doping profiles corresponding to FIG. 7.
Figure 9:
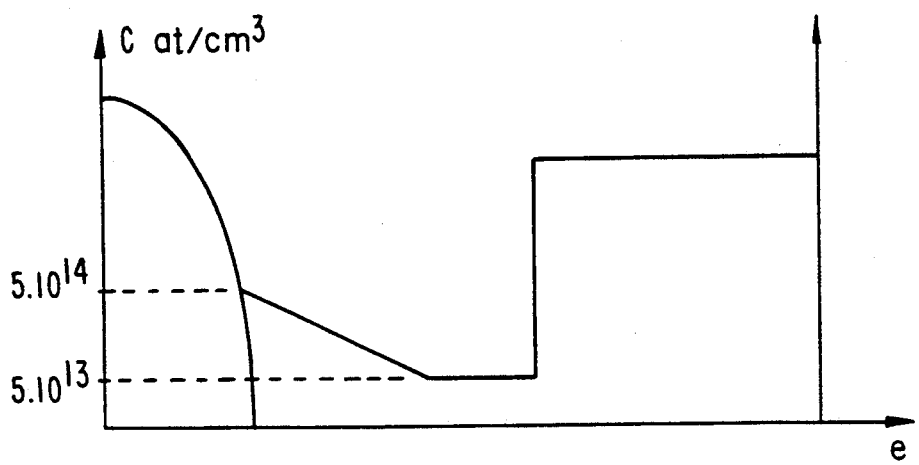

For this purpose, the instant invention provides for a P+N+ structure such as the one illustrated in FIG. 7 wherein the N area exhibits a concentration of carrier atoms as illustrated in FIG. 8 or 9, that is, a structure having a higher doping level, according to a step or a gradient, on the P+ region side. As in the above-mentioned patent, the N layer comprises an area having a very low doping level (of about $10^{13}$ to $10_{14}$ atoms/cm$^3$) and an area having a higher doping level ($10^{14}$ to $10^{15}$ atoms/cm$^3$) but the position of those areas with respect to the N+ and P+ layers is inverted. Moreover, the function of those areas and the phenomenon used are distinct. The phosphorus doping level has no direct effect but is only used for modulating the gold concentration and therefore the lifetime.

Indeed, when a diffusion of gold atoms is carried out, the concentration of the substitutional gold atoms will be higher in the N-type region exhibiting a higher phosphorus concentration. As a result, at the switching off, the carriers stored are discharged very rapidly in the more doped region (lower lifetime) and less rapidly discharged in the less doped region (higher lifetime) on the right-hand of FIGS. 8 and 9. One thus obtains a charge tank corresponding to the charges $Q_2$ of FIG. 4 permitting to avoid overoscillations at the blocking phase. The net thickness of the N-type layer will be selected so as to be equal or very slightly higher than the surface of the depleted area for the blocking rated voltage of the diode.

The step or gradient N layer is conventionally obtainable by epitaxy on an N+ substrate, as indicated in the above-mentioned patent.

The instant invention has been described for the specific case one wishes to modulate the gold concentration by means of phosphorus. It is conceivable to use metals other than gold, for example platinum, and dopants other than phosphorus, for example boron.

I claim:
1. A method for modulating the quantity of gold diffused in a silicon substrate comprising, diffusing phosphorus varying within a $10^{13}$ to $10^{15}$ atoms/cm$^3$ concentration range, into said substrate prior to subsequent diffusion of gold into said substrate the phosphorous concentration being increased at places wherein one wishes to increase the diffusion concentration of said gold.

2. A method for modulating the quantity of gold diffused in a silicon substrate according to claim 1, wherein said substrate in a quasi-intrinsic N-type substrate doped with phosphorus at a level of about $10^{14}$ atoms/cm$^3$ and wherein said phosphorus concentration is increased to about $10^{15}$ atoms/cm$^3$ at said places wherein one wishes to increase said gold concentration.

3. A method for modulating the quantity of gold diffused in a silicon substrate according to claim 1, wherein a region with a phosphorus doping gradient is formed inside said substance.

4. A method for modulating the quantity of gold diffused in a silicon substrate according to claim 1, wherein a region with a phosphorus doping step is formed inside said substrate.

5. A method for modulating the quantity of gold diffused in a silicon substrate according to claim 1, wherein said region having a variable concentration of phosphorus is formed by epitaxy on a non-doped or differently-doped substrate.

6. A method or manufacturing a PNN+ high-speed diode comprising, on an N+-type substrate, an N-type silicon epitaxial layer and a P+-type layer having a high doping level, the thickness of the epitaxial layer being such that, for the operating nominal voltage at the blocked state, the depleted area substantially spreads over the whole epitaxial layer, wherein:
said epitaxial layer is doped with phosphorus atoms at a concentration within the range of $10^{13}$ to $10^{15}$ atoms/cm$^3$ with a higher level on the P layer side, and gold atoms are diffused in the resulting structure.

7. A method for manufacturing a high-speed diode according to claim 6, wherein said epitaxial layer comprises a first sub-layer on said substrate side having a doping level of about $10^{13}$ to $10^{14}$ atoms/cm$^3$ and a second sublayer on the P+ layer side having a phosphorus concentration of about $10^{14}$ to $10^{15}$ atoms/cm$^3$.

8. A method for manufacturing a high-speed diode according to claim 7, wherein said epitaxial layer comprises a first phosphorus-doped substantially-intrinsic sublayer, the thickness of which is about half of its net thickness, and a second sub-layer wherein the concentration linearly varies by increasing from the place where it meets the first sub-layer to the place of the junction with the P+-type layer.

* * * * *